(12) United States Patent
Miller et al.

(10) Patent No.: US 7,508,227 B2
(45) Date of Patent: Mar. 24, 2009

(54) CLOSED-GRID BUS ARCHITECTURE FOR WAFER INTERCONNECT STRUCTURE

(75) Inventors: Charles A. Miller, Fremont, CA (US); John Matthew Long, San Jose, CA (US)

(73) Assignee: FormFactor, Inc., Livermore, CA (US)

( * ) Notice: Subject to any disclaimer, the term of this patent is extended or adjusted under 35 U.S.C. 154(b) by 0 days.

(21) Appl. No.: 11/866,024

(22) Filed: Oct. 2, 2007

(65) Prior Publication Data

US 2008/0024143 A1 Jan. 31, 2008

Related U.S. Application Data

(60) Division of application No. 10/832,700, filed on Apr. 27, 2004, now Pat. No. 7,276,922, which is a continuation of application No. 10/406,669, filed on Apr. 2, 2003, now Pat. No. 6,784,677, which is a division of application No. 09/613,531, filed on Jul. 10, 2000, now Pat. No. 6,603,323.

(51) Int. Cl.
  *G01R 1/073* (2006.01)
  *G01R 31/28* (2006.01)
(52) U.S. Cl. ...................... 324/754; 324/765
(58) Field of Classification Search .......... 324/754–765
  See application file for complete search history.

(56) References Cited

U.S. PATENT DOCUMENTS

| | | | |
|---|---|---|---|
| 3,068,403 A | 12/1962 | Robinson | |
| 3,821,645 A | 6/1974 | Vinsani | |
| 4,281,449 A | 8/1981 | Ports et al. | |
| 4,290,015 A | 9/1981 | Labriola | |
| 4,791,363 A | 12/1988 | Logan | |
| 4,853,624 A | 8/1989 | Rabjohn | |
| 4,862,077 A | 8/1989 | Horel et al. | |
| 4,894,612 A | 1/1990 | Drake et al. | |
| 4,968,931 A | 11/1990 | Littlebury et al. | |
| 4,994,735 A | 2/1991 | Leedy | |
| 5,012,187 A | 4/1991 | Littlebury | |
| 5,086,271 A | 2/1992 | Haill et al. | |
| 5,148,103 A | 9/1992 | Pasiecznik, Jr. | |
| 5,237,268 A | 8/1993 | Honma et al. | |
| 5,241,266 A | 8/1993 | Ahmad et al. | |

(Continued)

*Primary Examiner*—Ernest F Karlsen
(74) *Attorney, Agent, or Firm*—N. Kenneth Burraston

(57) ABSTRACT

An interconnect structure employs a closed-grid bus to link an integrated circuit tester channel to an array of input/output (I/O) pads on a semiconductor wafer so that the tester channel can concurrently communicate with all of the I/O pads. The interconnect structure includes a circuit board implementing an array of bus nodes, each corresponding to a separate one of the I/O pads. The circuit board includes at least two layers. Traces mounted on a first layer form a set of first daisy-chain buses, each linking all bus nodes of a separate row of the bus node array. Traces mounted on a second circuit board layer form a set of second daisy-chain buses, each linking all bus nodes of a separate column of the bus node array. Vias and other circuit board interconnect ends of the first and second daisy-chain buses so that they form the closed-grid bus. Each bus node is connected though a separate isolation resistor to a separate contact pad mounted on a surface of the circuit board. A set of spring contacts or probes link each contact pad to a separate one of the I/O pads on the wafer.

9 Claims, 10 Drawing Sheets

U.S. PATENT DOCUMENTS

Figure 1:
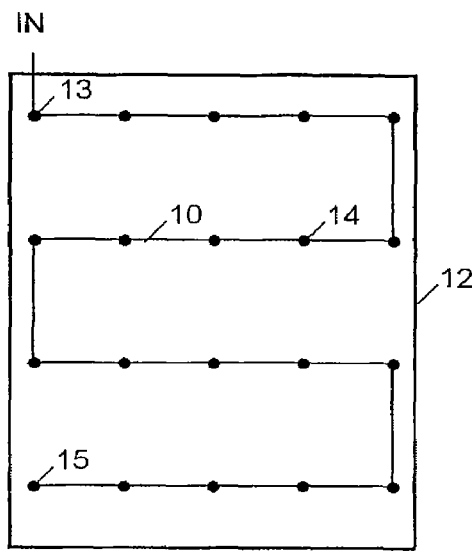

| | | |
|---|---|---|
| 5,294,776 A | 3/1994 | Furuyama |
| 5,307,010 A | 4/1994 | Chiu |
| 5,397,997 A | 3/1995 | Tuckerman et al. |
| 5,399,505 A | 3/1995 | Dasse et al. |
| 5,442,282 A | 8/1995 | Rostoker et al. |
| 5,444,366 A * | 8/1995 | Chiu ................. 324/158.1 |
| 5,457,400 A | 10/1995 | Ahmad et al. |
| 5,497,079 A | 3/1996 | Yamada et al. |
| 5,497,379 A | 3/1996 | Whetsel |
| 5,532,614 A | 7/1996 | Chiu |
| 5,541,524 A | 7/1996 | Tuckerman et al. |
| 5,548,223 A | 8/1996 | Cole et al. |
| 5,576,630 A | 11/1996 | Fujita |
| 5,592,632 A | 1/1997 | Leung et al. |
| 5,594,273 A * | 1/1997 | Dasse et al. ................. 257/620 |
| 5,608,335 A | 3/1997 | Tailliet |
| 5,608,337 A | 3/1997 | Hendricks et al. |
| 5,623,214 A * | 4/1997 | Pasiecznik, Jr. ............. 324/754 |
| 5,654,588 A | 8/1997 | Dasse et al. |
| 5,654,647 A | 8/1997 | Uhling et al. |
| 5,682,472 A | 10/1997 | Brehm et al. |
| 5,689,515 A | 11/1997 | Panis |
| 5,701,666 A | 12/1997 | DeHaven et al. |
| 5,736,850 A | 4/1998 | Legal |
| 5,794,175 A | 8/1998 | Conner |
| 5,852,581 A | 12/1998 | Betta et al. |
| 5,872,459 A * | 2/1999 | Pasiecznik, Jr. ............. 324/765 |
| 5,894,484 A | 4/1999 | Illes et al. |
| 5,898,312 A | 4/1999 | Uhling et al. |
| 5,917,329 A | 6/1999 | Cadwallader et al. |
| 5,952,838 A * | 9/1999 | Tikhonov .................... 324/754 |
| 5,990,696 A | 11/1999 | Swart |
| 5,995,915 A | 11/1999 | Reed et al. |
| 6,047,469 A | 4/2000 | Luna |
| 6,064,213 A | 5/2000 | Khandros et al. |
| 6,078,187 A | 6/2000 | Hanners et al. |
| 6,107,815 A | 8/2000 | Nikutta et al. |
| 6,107,818 A | 8/2000 | Czamara |
| 6,228,684 B1 * | 5/2001 | Maruyama .................. 438/113 |
| 6,275,962 B1 | 8/2001 | Fuller et al. |
| 6,351,134 B2 | 2/2002 | Leas et al. |
| 6,603,323 B1 | 8/2003 | Miller et al. |
| 6,703,854 B2 | 3/2004 | Hashimoto |
| 6,784,677 B2 | 8/2004 | Miller et al. |
| 6,812,691 B2 | 11/2004 | Miller |
| 6,917,214 B2 | 7/2005 | Farber et al. |
| 7,276,922 B2 | 10/2007 | Miller et al. |

* cited by examiner

CLOSED-GRID BUS ARCHITECTURE FOR WAFER INTERCONNECT STRUCTURE

CONTINUING DATA

This application is a DIV of Ser. No. 10/832,700, filed Apr. 27, 2004, now U.S. Pat. No. 7,276,922, which is a CON of Ser. No. 10/406,669 filed Apr. 2, 2003, now U.S. Pat. No. 6,784,677, which is a DIV of Ser. No. 09/613,531, filed Jul. 10, 2000, now U.S. Pat. No. 6,603,323.

BACKGROUND OF THE INVENTION

1. Field of the Invention

The present invention relates in general to an interconnect structure for providing signal paths between test equipment and contact pads on a semiconductor wafer, and in particular to a wafer interconnect structure employing a closed-grid bus to distribute signals to several integrated circuit devices under test.

2. Description of Related Art

In many applications microstrip or stripline traces convey a logic signal from a single source to many nodes on a printed circuit board (PCB). For example traces on a motherboard commonly distribute data, address and control lines of computer buses to sockets holding daughterboards, or traces on a PCB may distribute a clock signal to several synchronously operating integrated circuits (ICs) mounted on the PCB.

A typical integrated circuit (IC) tester includes a test head structure containing a set of tester channels. Each tester channel may either transmit a test signal to an IC input/output (I/O) terminal or monitor a IC output signal appearing at an IC I/O terminal to determine whether the IC is behaving as expected in response to its input signals. When ICs are tested while still in the form of die on a semiconductor wafer, a "prober" typically holds a wafer adjacent to the test head and provides a set of probes contacting I/O pads of one or more ICs. An interconnect structure is provided to link the tester channels to the probes. A typical interconnect structure includes a circuit board having upper and lower surfaces containing contact pads. A separate pogo pin extending from each tester channel contacts a separate one of the upper surface contact pads. An "interposer" mounted between the circuit board and the prober includes spring contacts linking the contact pads on the lower surface of the circuit board to the probes. Traces on various layers of the circuit board, and vias interconnecting those traces provide appropriate signal paths between the upper and lower contact pads.

Normally the interconnect structure links each tester channel to only a single I/O pad of a single IC. However in some cases, for example when a tester channel is supplying power to ICs under test, the interconnect structure may connect a single channel to more than power supply pad.

Since there are usually more I/O pads than available tester channels, an IC tester can test only a portion of the ICs on the wafer at any one time. Thus the "prober" holding the wafer must reposition the wafer under the probes several times so that all ICs can be tested. It would be advantageous if all ICs on a wafer could be contacted and tested concurrently without having to reposition the wafer.

One way to reduce the number of tester channels needed to do this is to concurrently connect the same tester channel to corresponding I/O pads of a large number of ICs on the wafer. For example an IC tester tests a random access memory (RAM) by writing data into each RAM address, reading it back out, and determining whether the data read out of the RAM matches the data written into it. When the tester has a sufficient number of channels to separately access I/O pads of more than one RAM, it can independently test several RAMs concurrently.

However it is also possible for a tester to concurrently test several RAMs without requiring so many tester channels by connecting the data and address I/O pads of several RAMs in parallel to the same set of tester channels while connecting the control I/O pads of the RAMs to separate tester channels. This arrangement enables the tester to concurrently write access several RAMs while allowing it to consecutively read access each RAM. The arrangement therefore reduces the number of write cycles needed to test the RAMs, substantially reduces the number of channels needed to concurrently test all of the RAMs on the wafer, and eliminates the need to position the wafer under the interconnect structure more than once. Thus instead of providing a set of signal paths, each connecting a single tester channel to a single IC pad, an interconnect structure for a wafer-level tester could provide a set of buses, each providing a path from a single tester channel to a large number probes accessing IC pads.

When such buses are formed by traces on a printed circuit board (PCB) each bus should make efficient use of PCB area since many buses must share a relatively small amount of PCB area above each IC. Also each bus should deliver the signal to ICs with as little variation in edge timing as possible and with as little distortion as possible.

Logic signals have been commonly distributed to many nodes on a PCB using stripline or microstrip traces in a "daisy-chain", or "star" or "stubbed" bus configurations. FIG. 1 illustrates a conventional daisy-chain bus configuration wherein traces 10 on a PCB 12 connect a set of bus nodes 14 in series to route an incoming signal (IN) to each bus node. The daisy-chain configuration makes efficient use of PCB space. However since each IN signal edge must travel a relatively large distance between the first and last nodes 13 and 15, and must charge IC input capacitance as it arrives at several intermediate nodes 14, the time difference between detection of IN signal edges by ICs connected to nodes 13 and 15 can be relatively large. A long-daisy chain bus can also severely distort the signal wave front as it passes from node-to-node; the last node on the bus will see substantially slower rise time than the first. Such wave front distortion tends to increase the variation in signal path delay between the first and last nodes 13 and 15 on the daisy-chain bus.

A daisy-chain bus is also intolerant of open-circuit faults; an open circuit fault anywhere on the daisy-chain bus will prevent the signal from reaching any node beyond the fault. Since an interconnect structure for a wafer-level tester would have a large number buses formed by small traces, since each bus would include a large number of nodes on each bus, and since each bus would be implemented by small traces, there would be many places on the bus were a fault could occur, and any one fault would render the interconnect structure unsuitable for use in a wafer-level tester interconnect system since several ICs on each wafer would be untestable.

Figure 2:
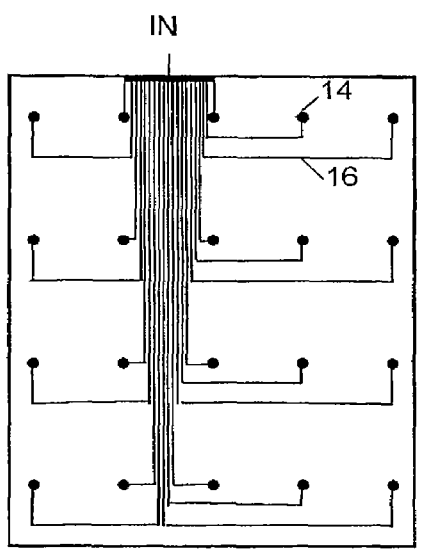

FIG. 2 illustrates a star bus in which the incoming signal is directly linked to each node 14 by a separate trace 16. A star bus has a number of advantages over a daisy-chain bus. Though not apparent in FIG. 2, when all traces 16 are of similar length, input signal edges will arrive at all nodes 14 at substantially the same time. A star bus distorts and attenuates signals less than a daisy-chain bus, and every node 14 sees substantially the same wave front shape. A star bus is also relatively more tolerant of open circuit faults than a daisy-chaining bus since an open circuit on any trace 16 will prevent the signal for reaching only one node 14. However even a single open circuit fault would none-the-less render an interconnect structure employing a star bus unsuitable in a wafer-testing because it would mean that one IC on each wafer would be untestable. Also since a star bus requires substantial amounts of circuit board space, it would be unsuitable as a bus in an interconnect structure for a wafer-level IC tester where a large number of buses would be concentrated into a small area.

Figure 3:
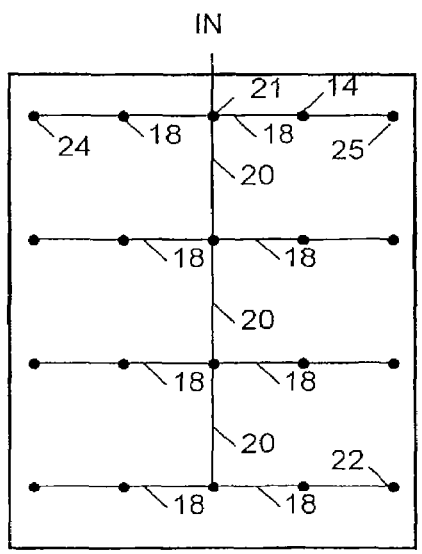

FIG. 3 illustrates a prior art stubbed bus arrangement. The stubbed bus of FIG. 3 includes a core daisy-chain bus 20 and several daisy-chain branch buses or "stubs" 18. Each stub 18 has a proximal end connected to core bus 20 and a distal end remote from core bus 20. The traces of stubbed bus of FIG. 3 use about the same amount of PCB space as the daisy-chain bus of FIG. 1, but the stubbed bus substantially reduces variation in timing of signal edges arriving at its nodes because it reduces the variation in signal path distance the incoming signal must travel in reaching the nearest and most distant nodes 21 and 22.

The stubbed bus arrangement is often preferable over the star bus arrangement of FIG. 2 when a moderate variation in input timing at nodes 14 is acceptable because it uses less circuit board space. However the reduction in signal path delay variation over that of a daisy-chain bus is not as great as we might expect based on the decrease in signal path distances alone.

Figure 4:
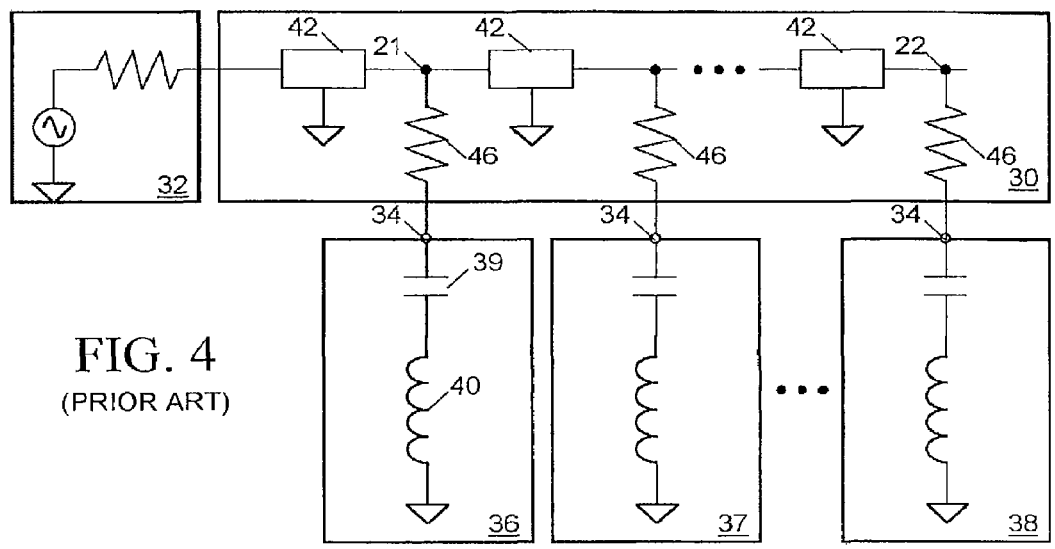

FIG. 4 is an equivalent circuit diagram of a portion of a stubbed bus interconnect system 30 distributing a test signal from a tester channel 32 to I/O pads 34 of a set of ICs 36-38. The input impedance of each IC 36-38 is modeled as a capacitor 39 (e.g., 5 pf) in series with an inductor 40 (e.g., 1.5 nH). The interconnect system is modeled as a set of 50 Ohm lossy transmission line segments 42 having series inductance (e.g., 333 nh/meter), series resistance (e.g. 0.5 Ohm/meter) and shunt capacitance (e.g., 133.3 pf/meter). An isolation resistor 46 (e.g., 1000 Ohms) is provided between bus each node on the PCB and an IC I/O pad 34. Isolation resistors 46 limit the load tester channel 32 and prevent a short circuit fault at or near any I/O pad 34 from severely attenuating a test signal passing though interconnect system 30.

Figure 5:
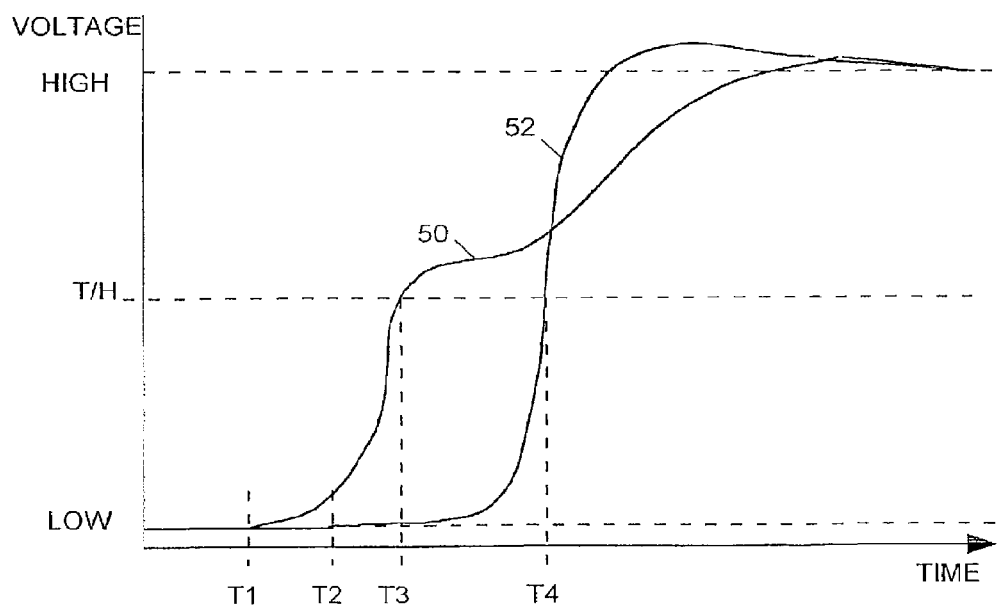

Assume tester channel 32 produces a square wave test signal rising from a low logic level to a high logic level. As the test signal edge travels from tester channel 32 to all pads 34 via interconnect system 30, the interconnect system distorts the signal, and the wave front appears a little different to each IC I/O pad 34. FIG. 5 is a timing diagram illustrating the appearance of a test signal wave front 50 as it may be seen by the I/O pad 34 of the IC 36 connected to the node 21 nearest to channel 32 and the test signal wave front 52 as seen by the I/O pad 34 of the IC 38 connected to the node 22 most distant from channel 32. Wave front 50 begins its rise at time T1, and wave front 52 begins its rise a short time later at time T2. The time delay T2-T1 represents the time a signal requires to travel between the node 21 and node 22 via the most direct path. That delay is a function of the minimum signal path distance between the two nodes. If we assume that the ICs 36 and 38 recognize a state change in the test signal when its wave front rises above a threshold level (T/H) midway between the signals nominal high and low logic levels, then IC 36 will see the state change at time T3 and IC 38 will see the state change at time T4. Note that the delay between times T3 and T4 at which ICs 36 and 38 detect state changes is substantially larger than the signal path delay (T2-T1) between the two ICs.

Note also that the effective difference in signal timing at the bus nodes is thus much greater than can be accounted for by the difference in signal path lengths between the two ICs. The additional delay is caused by the difference in signal distortion. Note that wave front 50 rises more rapidly toward the T/H than wave front 52. This happens because the early portions of the wave front reaching ends of stubs are reflected back to node 21 adding to the rate at which capacitance at that node is charged prior to time T3. Since the IC 38 most distant from the test signal source 32 seeing signal 52 is near the end of a stub, the reflection has a more pronounced effect at the end of signal 52. Note the substantial overshoot of waveform 52 of FIG. 5.

The daisy-chain bus of FIG. 1 requires the IN signal to travel through 19 path segments when it travels between the first and last nodes 13 and 15. The stubbed bus of FIG. 3 requires the IN signal to travel through only 5 segments of similar length when traveling between the two most widely separated nodes 21 and 22. Thus when we abandon the daisy-chain bus of FIG. 1 in favor of the stubbed bus of FIG. 3, we might expect a $14/19$ths reduction in signal timing variation. However FIG. 5 tells us that we would be disappointed; we would see a reduction in signal timing variation, but not as much as we would have expected. The stubbed bus also distorts the signals more than a daisy-chain and can produce substantial overshoot at the bus nodes. The signal distortion caused by reflections at the stubs ends is very much a function of the layout of the stub network, termination and transmission line impedances and signal frequencies. However that distortion will typically augment the variation in signal path delay.

Like a daisy-chain bus, an open circuit fault on the stubbed bus can prevent the input signal from reaching more than one node 14. Hence an open circuit fault in a stubbed bus incorporated into an interconnect system for a wafer-level integrated circuit would also render the interconnect system unsuitable for use.

What is needed is a transmission line structure for conveying a signal to several PCB nodes that makes more efficient use of PCB space than a star bus, exhibits substantially less variation in signal path delay than a daisy-chain bus, provides less distortion than a daisy-chain or stubbed bus, and maintains signal integrity at all nodes in spite of an open-circuit fault.

SUMMARY OF THE INVENTION

An interconnect structure in accordance with the invention employs a closed-grid bus to link an integrated circuit tester channel to an array of input/output (I/O) pads on a semiconductor wafer so that the tester channel can concurrently communicate with all of the I/O pads.

The interconnect structure includes a circuit board with sets of contact pads mounted on its upper and lower surfaces. Each upper surface contact pad suitably receives a pogo pin, coax cable or other conductor from a corresponding one of the tester channels. Spring contacts formed on the semiconductor wafer suitably link each wafer I/O pad to a separate one of the contact pads on the lower surface of the circuit board.

Traces on the circuit board implement an array of bus nodes, each corresponding to a separate one of the I/O pads on the wafer. The circuit board includes at least two layers. Traces mounted on a first circuit board layer form a set of first daisy-chain buses, each linking all bus nodes of a separate row of the bus node array. Traces mounted on a second circuit board layer form a set of second daisy-chain buses, each linking all bus nodes of separate column of the bus node array. Vias and other circuit board interconnect ends of the first and second daisy-chain buses so that they form the closed-grid bus interconnecting all of the bus nodes.

The closed-grid bus makes nearly as efficient use of available space on the PCB layers as conventional stubbed and daisy-chain buses, yet produces less variation in signal path delay between bus nodes, provides less signal distortion and is more tolerant of open circuit faults.

It is accordingly an object of the invention to provide a bus for distributing a signal to several nodes.

The concluding portion of this specification particularly points out and distinctly claims the subject matter of the present invention. However those skilled in the art will best understand both the organization and method of operation of the invention, together with further advantages and objects thereof, by reading the remaining portions of the specification in view of the accompanying drawing(s) wherein like reference characters refer to like elements.

BRIEF DESCRIPTION OF THE DRAWING(S)

Figure 6:
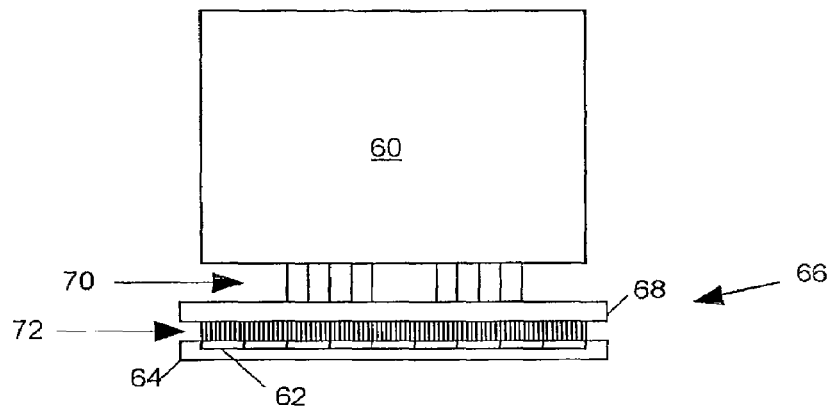
Figure 7:
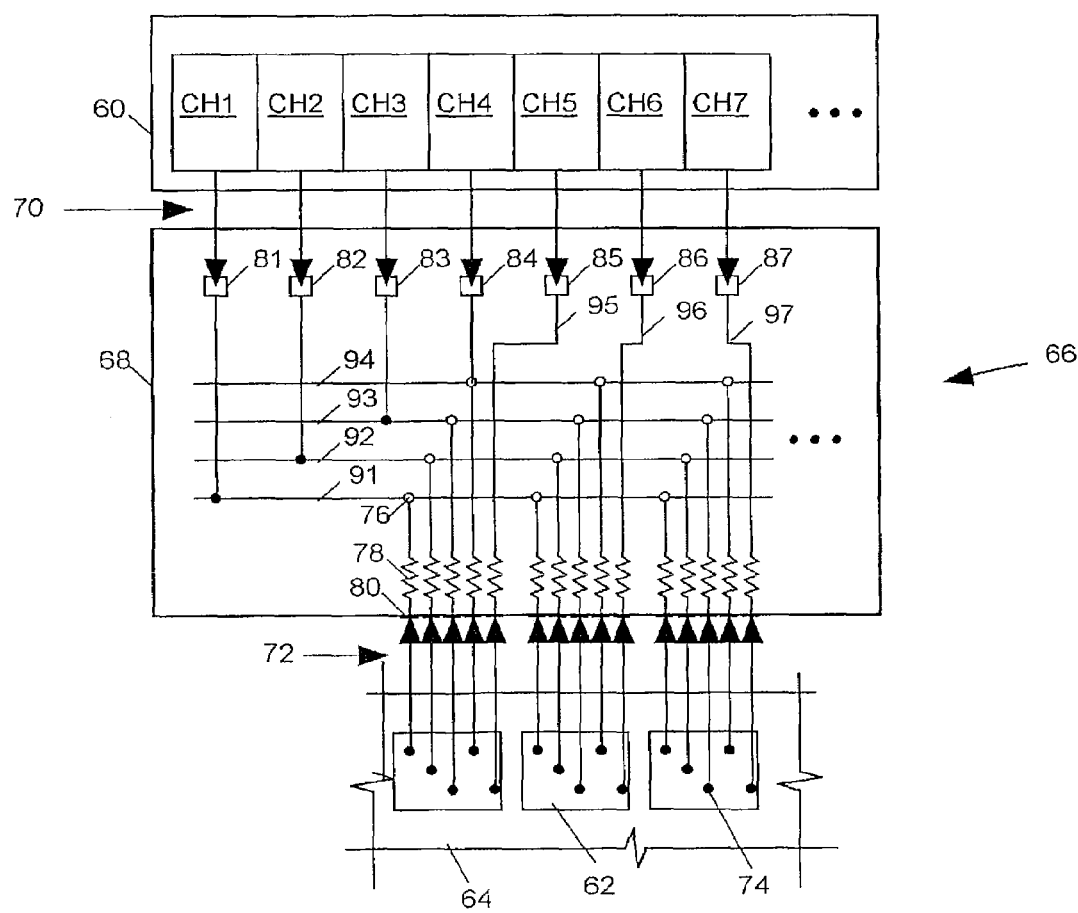
Figure 8:
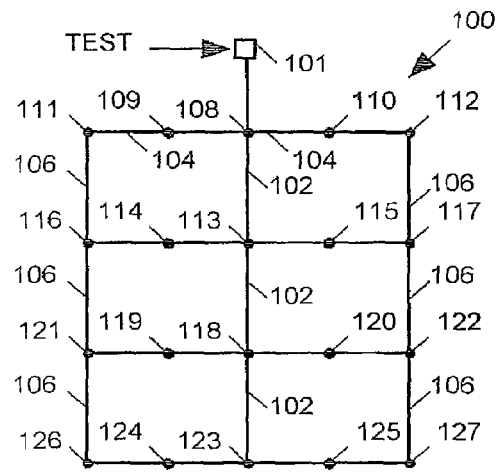
Figure 10:
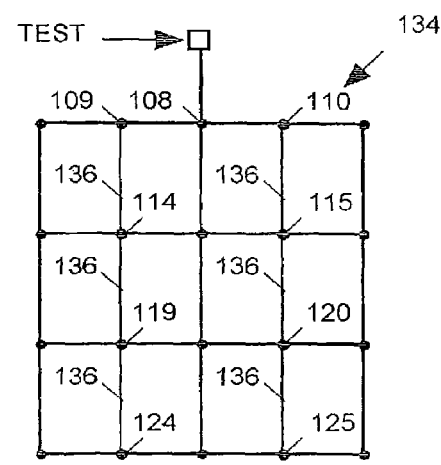
Figure 9:
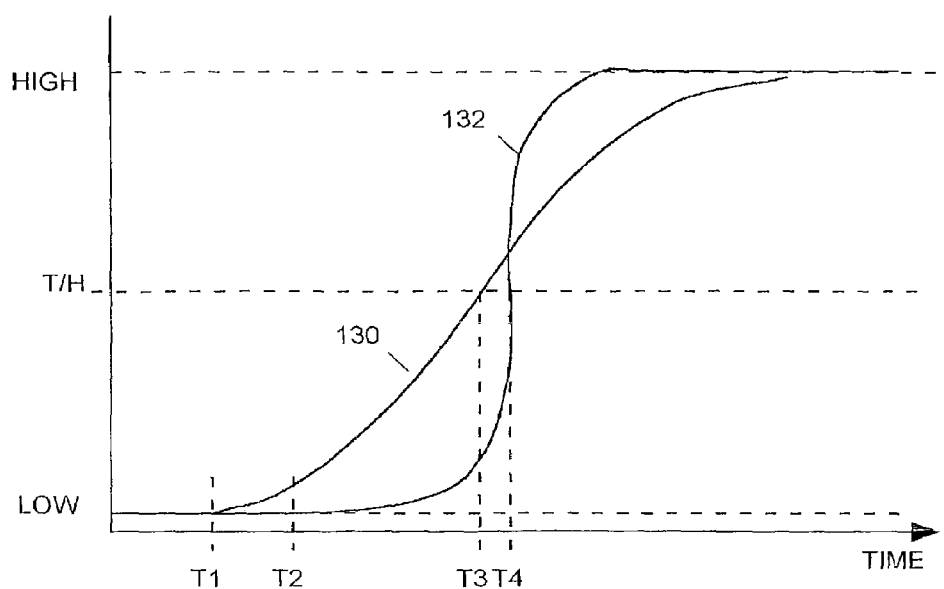
Figure 11:
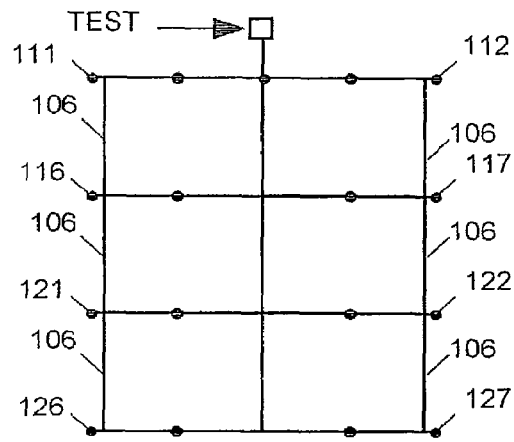
Figure 12:
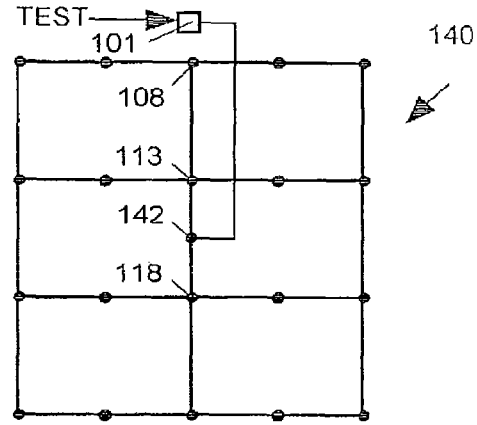
Figure 13:
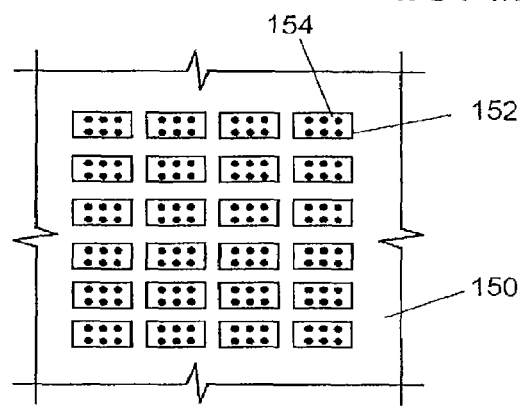

FIG. 1 illustrates a conventional daisy-chain bus,
FIG. 2 illustrates a conventional star bus;
FIG. 3 illustrates a conventional stubbed bus;
FIG. 4 is an equivalent circuit diagram of a portion of the stubbed bus of FIG. 3;
FIG. 5 is a timing diagram illustrating the appearance of test signal wave fronts at two nodes of the stubbed bus of FIG. 4,
FIG. 6 is a simplified side elevation view of a test head of a wafer-level integrated circuit tester accessing integrated circuits implemented on a semiconductor wafer via an interconnect structure employing a closed-grid bus in accordance with the invention,
FIG. 7 is a simplified electrical block diagram of the test head, wafer, and interconnect system of FIG. 6,
FIG. 8 is a plan view of an example a closed-grid bus in accordance with the invention,
FIG. 9 is a timing diagram illustrating the appearance of a test signal wave front as seen by the two I/O pads on the wafer of FIG. 6 arriving via the close-grid bus of FIG. 8;
FIGS. 10-12 illustrate modified versions of the closed-grid bus of FIG. 8,
FIG. 13 is a simplified plan view of a portion of a semiconductor wafer containing an array of ICs,
FIGS. 14-18 are simplified (not to scale) plan views of portions of each of five layers of an interconnect structure in accordance with the invention implementing six closed-grid buses in accordance with the invention, and
FIG. 19 is a plan view of the layers of FIGS. 14-16 superimposed on one another.

DESCRIPTION OF THE PREFERRED EMBODIMENT(S)

FIG. 6 is a simplified side elevation view of a test head 60 of a wafer-level integrated circuit tester accessing integrated circuits 62 implemented on a semiconductor wafer 64 via an interconnect system 66. FIG. 7 is a simplified electrical block diagram of test head 60, wafer 64 and interconnect system 66 of FIG. 6. For simplicity test head 60 is illustrated in FIG. 7 as including a set of only seven tester channels CH1-CH7, though a test head will typically include many more channels. Each tester channel CH1-CH7 is capable of sending a test signal to an I/O pad 74 of one or more of ICs 62 or of monitoring an IC output signal appearing at one or more IC pads to determine whether the IC is behaving as expected. All ICs 62 on wafer 64 are similar and therefore have a similar I/O pad arrangement. For simplicity only five I/O pads 74 are shown in FIG. 7 and test head 60 is illustrated in FIG. 7 as including a set of only seven tester channels CH1-CH7. However each IC 62 has many more than five I/O pads 74 and the tester includes many more than seven tester channels.

In some applications it is possible to allow the same tester channel to concurrently access corresponding pads of more than one IC 62. For example, an IC tester typically tests a random access memory (RAM) by writing data into each RAM address, reading it back out, and determining whether the data read out of the RAM matches the data written into it. In such application interconnect system 66 may connect the data, address and some of the control I/O pads 74 of several RAMs in parallel to the same set of tester channels while connecting, for example only a read/write control I/O pad of the RAMS to separate tester channels. With such interconnect arrangement, the tester can concurrently write access several RAMs then successively read access each RAM. Such an interconnect arrangement can reduce the number of channels needed to test all the ICs on a wafer or reduce the number of times the wafer has to be repositioned under the interconnect structure and reduces the total number of write cycles needed to test all of the RAMs. Thus interconnect system 66 can speed up wafer testing.

The present invention relates to the manner in which interconnect structure 66 links various tester channels CH1-CH7 to more than one IC I/O pad. Note that as shown in FIG. 7, while interconnect structure 66 links each of channels CH5-CH7 to a pad of a separate one of ICs 62, interconnect structure 66 links each channel CH1-CH4 to corresponding I/O pads 74 to three ICs 62. Interconnect structure 66 also links some each of channels CH5-CH7 to a corresponding pad of a separate one of ICs 62.

Interconnect structure 66 includes a printed circuit board (PCB) 68, a set of pogo pins 70 and a set of spring contacts 72. The conductive spring contacts 72 are formed on the upper surface of wafer 64, each extending upward from a separate I/O pad 74 to contact one of a set of contact pads 80 formed on an underside of interconnect structure 66. Pogo pins 70 (or, alternatively, other conductors such as coaxial cables) extend downward from channels CH1-CH7 to contact a set of pad 81-87 formed on the upper surface of circuit board 68. PCB 68 includes traces and vias forming a set of buses 91-94 linking pads 81-84 to a set of bus nodes 76. A set of isolation resistors 78 link each bus node 76 to a corresponding pad 80. Other signal paths 95-97 link pads 85-87 to corresponding ones of pads 80 via others of isolation resistors 78.

Resistors 78 are isolation resistors; they prevent a short to ground at any I/O pad from affecting the ability of any bus 91-94 to convey test or IC output signals to other I/O pads 74. Thus a short circuit in any IC 62 will not inhibit testing of other ICs. Isolation resistors 78 also reduce the loading on the channels CH1-CH7. Isolation resistors 78 need not be necessarily be included in the signal paths connecting channels CH5-CH7 to ICs 62.

Interconnect Bus Architecture Criteria

The present invention relates in particular to the architecture of the buses 91-94 within PCB 68, each of which distributes a test signal from one of channels CH1-CH4 arriving at one of pads 81-84 to several bus nodes 76, or conveys IC output signals arriving at any of several nodes 76 back to one of pads 81-84. As discussed in detail below, the signal paths within PCB 68 are formed by traces on various layers of the PCB and vias linking the layers. Although only four buses 91-94 are shown in the simple example of FIG. 7, a practical implementation of interconnect structure 66 may include a large number of such buses concentrated into a relatively small volume. For example to concurrently test several memory ICs having 64 data and address lines PCB 68 could implement 64 such interconnect buses.

To facilitate proper signal timing during a test, it is important to keep variations in signal path delay between any channel CH1-CH4 and each IC I/O pad to which it is linked within a relatively narrow range. For test signals, the signal path delay is the time interval between the moment one of channels CH1-CH4 generates a state change in an output test signal and the time one of ICs 62 detects that state change in the test signal as it arrives at a pad. For IC output signals, the signal path delay is the time interval between the moment an IC 62 produces a state change in an output signal at an I/O pad 74 and the time one of channels CH1-CH4 detects output signal the state change. Thus we would also like to provide buses 91-94 that limit variations in signal path delay.

A prior art "daisy-chain" bus architecture as illustrated in FIG. 1 can make efficient use of available PCB trace space. Implementing buses 91-94 as daisy-chain buses would have several drawbacks. Since an input signal (IN) is attenuated as it passes each node 14, a daisy-chain bus can severely attenuate a signal by the time it reaches the node 15 most distant from the signal sources. Also the variation in signal path delay between a first and last nodes of a daisy-chain bus can be large, and an open circuit fault anywhere in the daisy-chain bus can prevent the test signal from arriving at one or more circuit nodes.

A prior art "star" bus as illustrated in FIG. 2 provides a separate signal path 16 from an input signal source to each node 14, and (though not shown in FIG. 2) when the paths are designed to be of similar length, a star bus can provide a similar signal path delay for all nodes. However a star bus would be unsuitable for implementing buses 91-94 because it does not make very efficient use of PCB space. Also an open circuit fault in a star bus would prevent a signal from arriving at a node 76, thereby preventing the tester from properly testing one of ICs 62.

FIG. 3 illustrates a prior art stubbed bus formed by a daisy chain core bus 20 to which several daisy-chain branches or "stubs" 18 are connected. A stubbed bus would be preferable over either the daisy-chain or star bus of FIGS. 1 and 2 for implementing buses 91-94 because it makes more efficient use of PCB space than a star bus and transmits signals with less attenuation and signal path delay variation than a daisy-chain bus. However reflections at the ends of the stubs 20 cause signal distortion and increase variation in signal path delay, and an open circuit fault anywhere in the stubbed bus would prevent the tester from properly testing one or more of ICs 62.

In accordance with the invention, each bus 91-94 is implemented as a "closed-grid" bus. As discussed below, a closed-grid bus makes almost as efficient use of PCB space as a stubbed bus, but does not produces as much signal distortion or signal timing variation as a stubbed bus. A closed-grid bus is also tolerant of open circuit faults in the conductors forming the bus because it provides redundant paths between each bus node 76 and one of contact pads 81-87. Thus when implemented as closed-grid buses, any of buses 91-94 can have one (or more) one open-circuit faults while still maintaining test signal integrity at all bus nodes 76.

Closed-Grid Bus Architecture

FIG. 8 is a plan view of an example a "closed-grid" bus 100 in accordance with the invention for distributing a test signal (TEST) arriving at a pad 101 to a set of 20 bus nodes 108-127. Nodes 108-127, similar in function to bus nodes 76 of FIG. 7, may be similarly linked through isolating resistors and spring contacts to I/O pads of ICs under test.

Closed-grid bus 100 may be thought of as an improvement to the conventional stubbed bus illustrated in FIG. 3. Like the stubbed bus, closed-grid bus 100 includes a set of traces forming a core bus 102 and forming several branch buses 104 having proximal ends connected to the core bus. However unlike a stubbed bus, an additional set of traces 106 link points at (or near) the distal ends of adjacent branch buses 104. Thus core bus 102, branch buses 104 and traces 106 form a grid providing the incoming TEST signal with more than one path to each node 109-127. Note also that the grid is "closed" in that it has no unconnected stub ends of substantially length relative to the wave length of the signal being conveyed by the bus; all signal paths are loops and there is more than one path to each bus node.

Assume the TEST signal input to pad 101 is driven from a low logic level to a high logic level and that receiver circuits in the ICs under test determine that the TEST signal changes state when it rises above a threshold level midway between its low and high logic levels. We would like the voltage at each node 108-127 to rise to that threshold level as nearly as possible at the same time to minimize variation in time at which receiver circuits linked bus nodes 108-127 detect a TEST signal state change.

The TEST signal will drive all of nodes 108-127 to the high voltage level, but first it must supply enough energy into each node to charge the input capacitance of the IC pad linked to that node. Since the TEST signal edge arrives at node 108 before it arrives at any other node 109-127, it will begin charging the capacitance at node 108 before it begins charging the capacitance at any other. The TEST signal will begin charging nodes 126 and 127 last since it must travel the greatest distance to reach those nodes. When the wave front of the incoming TEST signal reaches node 108, only a portion of the TEST signal energy passes into node 108 and begins charging the capacitance at that node. Much of the TEST signal energy passes on to nodes 109, 110 and 113, and some of the TEST signal energy is reflected back toward pad 101. A similar splitting and reflection of TEST signal energy happens as the TEST signal wave front reaches each other node 109-127. Since such splitting of TEST signal energy at each node helps to reduce the variation in signal path delay. It is helpful to provide as many paths as possible between nodes.

Referring to the prior art stubbed bus of FIG. 3, when the IN signal wave front arrives at nodes 24 and 25, all of the energy that cannot be immediately absorbed into nodes 24 and 25 is reflected back to node 21 because the stubbed bus architecture gives that excess energy no place else to go. Since the reflected energy can be substantial, it can substantially increase the charging rate at node 21. Waveform 50 of FIG. 5 represents the voltage rise we might see at node 21. The distortion in the early part of waveform 50 prior to time T3 is due primary to the substantial signal reflection at 24 and 25. The distortion in waveform 50 around time T3 due to reflections from the stub ends causes waveform 50 to reach the threshold logic level (T/H) quickly. Waveform 52 of FIG. 5 represents the voltage rise at the most distant node 22 of the stubbed bus of FIG. 3. Unlike waveform 50, waveform 52 does not exhibit have a large bump from signal reflections during the early part of its rise because energy from reflections is more evenly distributed by the time it reaches node 22. Thus waveform 52 rises to the threshold level more slowly. The difference in rise time to the threshold levels of waveforms 50 and 52 increases the difference (T4−T3) between the signal path delays.

The closed-grid bus 100 of FIG. 8 reduces the reflections by providing the additional traces 106 interconnecting the stub ends. Thus when the TEST signal wave front arrives at nodes 111 and 112, much of the excess energy travels on to nodes 116 and 117 and to other nodes 114, 115, 121, 122 and beyond, and less of the excess TEST signal energy is reflected back toward node 108. With less energy being reflected back to node 108 from nodes 111 and 112, capacitance at node 108 does not charge as fast as it would if traces 106 were omitted. Since node 108 of the closed-grid bus of FIG. 8 does not increase to the logic threshold voltage as fast as node 21 of the stubbed bus of FIG. 3, the closed-grid bus exhibits less variation in signal path delay.

FIG. 9 is a timing diagram illustrating the appearance of a test signal wave front 130 as seen by the I/O pad of an IC connected to node 108 and a TEST signal wave front 132 as seen by an I/O pad an IC connected to node 127. Wave front 130 begins its rise at time T1 and wave front 132 begins its rise a short time later at time T2. The time delay T2−T1 represents the time the wave front requires to travel between the node 108 and 127. The IC pad connected to node 108 will detect a state change at time T3 and the IC connected to node 127 will see a state change at time T4. We see that the time difference T4−T3 is smaller for the closed-grid system as may seen in FIG. 9 than for the stubbed bus system as may be seen from FIG. 5. Since less reflected TEST signal energy returns to node 108 prior to time T3, the node does not charge as quickly to the threshold level as node 21 of FIG. 3. Thus the closed-grid bus has less variation in signal path delay than a similarly arranged stubbed bus.

We can also see by comparing FIGS. 9 and 5, that waveforms 130 and 132 of the closed-grid bus are less distorted than the waveforms 50 and 52 of the stubbed bus and exhibit less overshoot. Thus the closed-grid bus of the present invention maintains better signal integrity than the prior art stubbed bus.

Note that a single fault anywhere in closed-grid bus 100 (other than between pad 101 and node 108) will not prevent the TEST signal from arriving at any node 108-127 because there are more than one signal path between bus node 108 to any other bus node. Thus closed-grid bus 100 is open-circuit fault tolerant. When we implement buses 91-94 of FIG. 7 with a closed-grid bus, it would require at least two open-circuit faults in one of buses 91-94 to render the interconnect system 66 unable to deliver signals between a pad 81-84 and the nodes 76 linked by the bus.

FIG. 10 illustrates a closed-grid bus 134 similar to closed-grid bus 100 of FIG. 8 except that it includes an additional set of traces 136 interconnecting nodes 109, 114, 119, and 124, and interconnecting nodes 110, 115, 120 and 125. Traces 136 further reduce the signal reflections, for example, from nodes 109 and 110 back to node 108 because they provide additional pathways to convey current away from those nodes. Thus the additional pathways 136 in closed-grid system 134 further reduce the variation in signal path delay over closed-grid system 100 of FIG. 8. However the reduction in signal path delay variation obtained by adding traces 136 to bus 100 of FIG. 8 is much smaller than is obtained by adding traces 106 to convert the stubbed bus of FIG. 3 into the closed-grid bus of FIG. 8. Referring to FIG. 8, it is more helpful to reduce reflections at the nodes 111 and 112 at ends of stubs nearest the first node 108 since those reflections carry the most energy and arrive back at node 108 early, thereby accelerating the voltage build-up at node 108 to the threshold level. However bus 134 of FIG. 10 is somewhat more fault tolerant than bus 100 of FIG. 8 because it provides more signal paths to bus nodes 109, 110, 114, 115, 119, 120, 124 and 125.

FIG. 11 illustrates an alternative version of the closed-grid bus of FIG. 8 in which conductor 106 are connected substantially near, but not precisely at the distal ends of the daisy-chain buses linking four rows of bus nodes 108-127. Thus in the bus of FIG. 19 destination nodes 111, 112, 116, 117, 121, 122, 126 and 127 are at the ends of short stubs. However the bus of FIG. 19 still comprises a closed-grid bus and will behave in a manner substantially similar to the closed-grid bus of FIG. if those short stubs are relatively small in relation to the wavelength of the highest frequency signal to be conveyed by the bus. Thus we can convert the prior art stubbed bus of FIG. 3 to a closed grid bus by linking adjacent stubs at points either at or near their ends.

FIG. 12 illustrates another closed-grid bus 140 that is generally similar to bus 100 of FIG. 8 except that, rather than being linked to node 108 at one end of the bus, pad 101 is linked to the bus between nodes 113 and 118 at a point 142 having the smallest maximum distance to any node. This further reduces the variation in pad-to-node signal path delay.

Example PCB Layout

FIG. 13 is a simplified plan view of a portion of an example semiconductor wafer 150 containing a 4×5 array of ICs 152, each IC having 6 pads 154. FIGS. 14-19 describe a layout for a PCB within an interconnect structure that will provide six closed-grid buses, each linking a separate set of twenty corresponding I/O pads 154 of all twenty ICs 152 to a separate tester channel.

Figure 14:
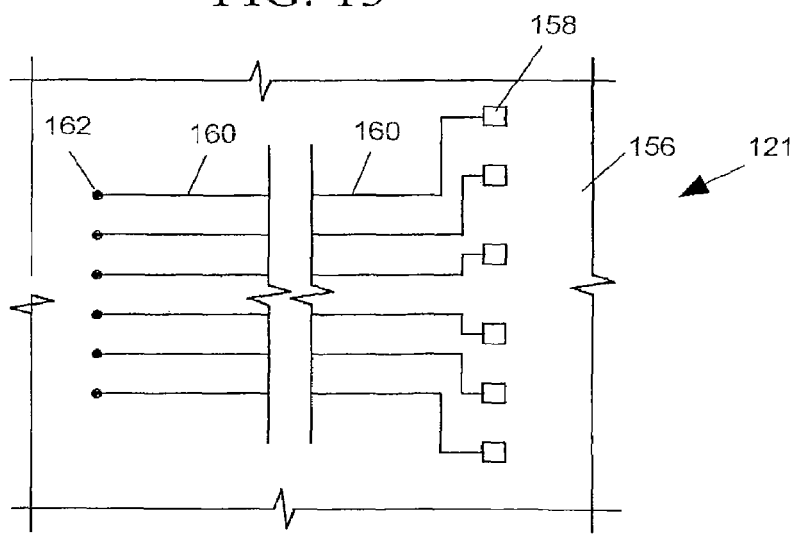

FIG. 14 is a simplified (not to scale) plan view of a portion of the top layer 121 of the PCB. A set of six conductive pads 158 are arranged on layer 156 to receive pogo pin or coaxial conductors from the six channels. A set of traces 160, suitably of similar length, link pads 158 to a set of six vias 162 passing downward to a next lower layer of the PCB.

Figure 15:
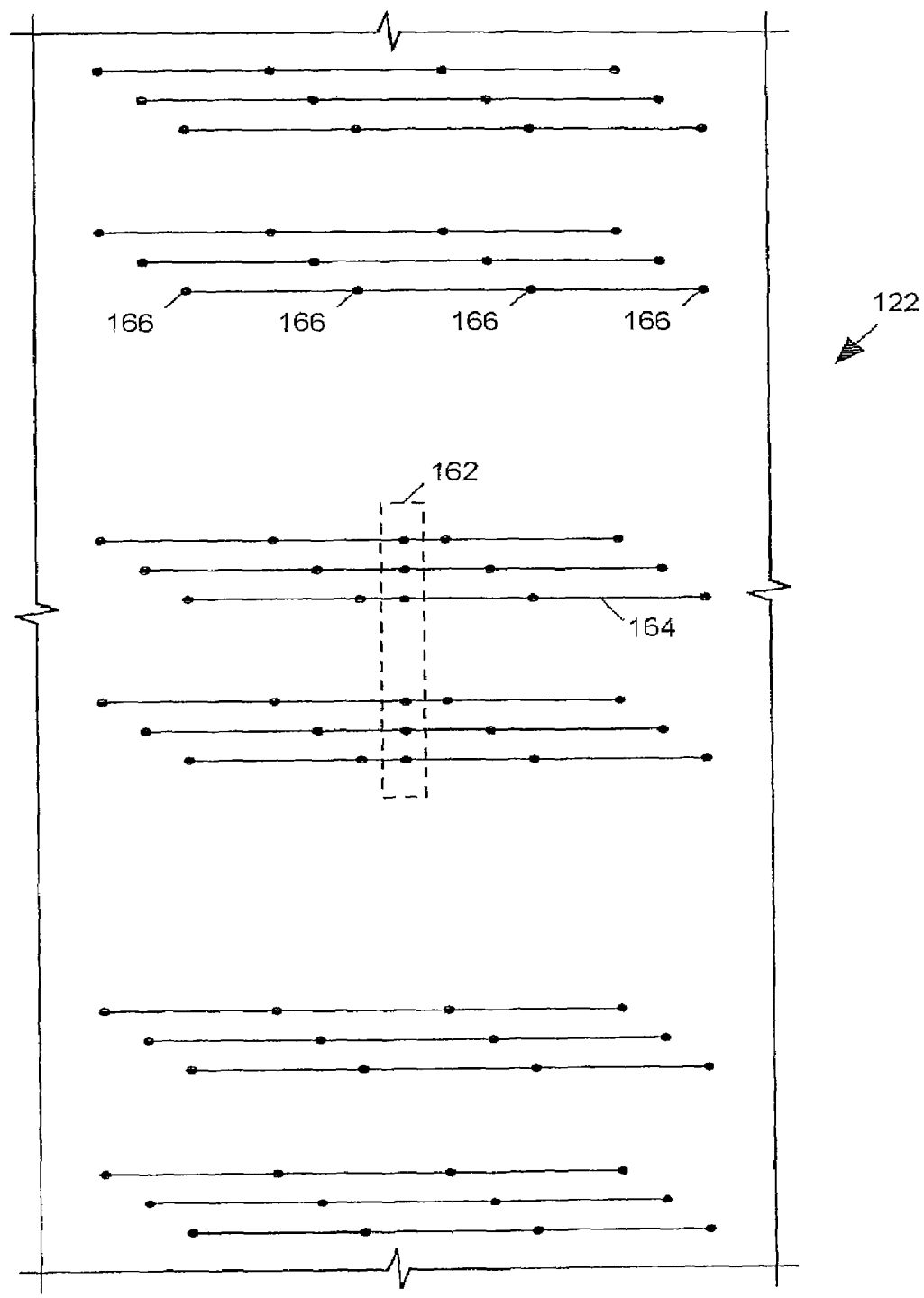

FIG. 15 is a simplified (not to scale) plan view of a portion of that next lower layer 122. Layer 122 includes a set of eighteen traces 164 extending along "east/west" axes. The six vias 162 from top layer 121 are each linked to a separate one of traces 164. A separate set of four vias 166 link each trace 164 to traces on a next lower PCB layer.

Figure 16:
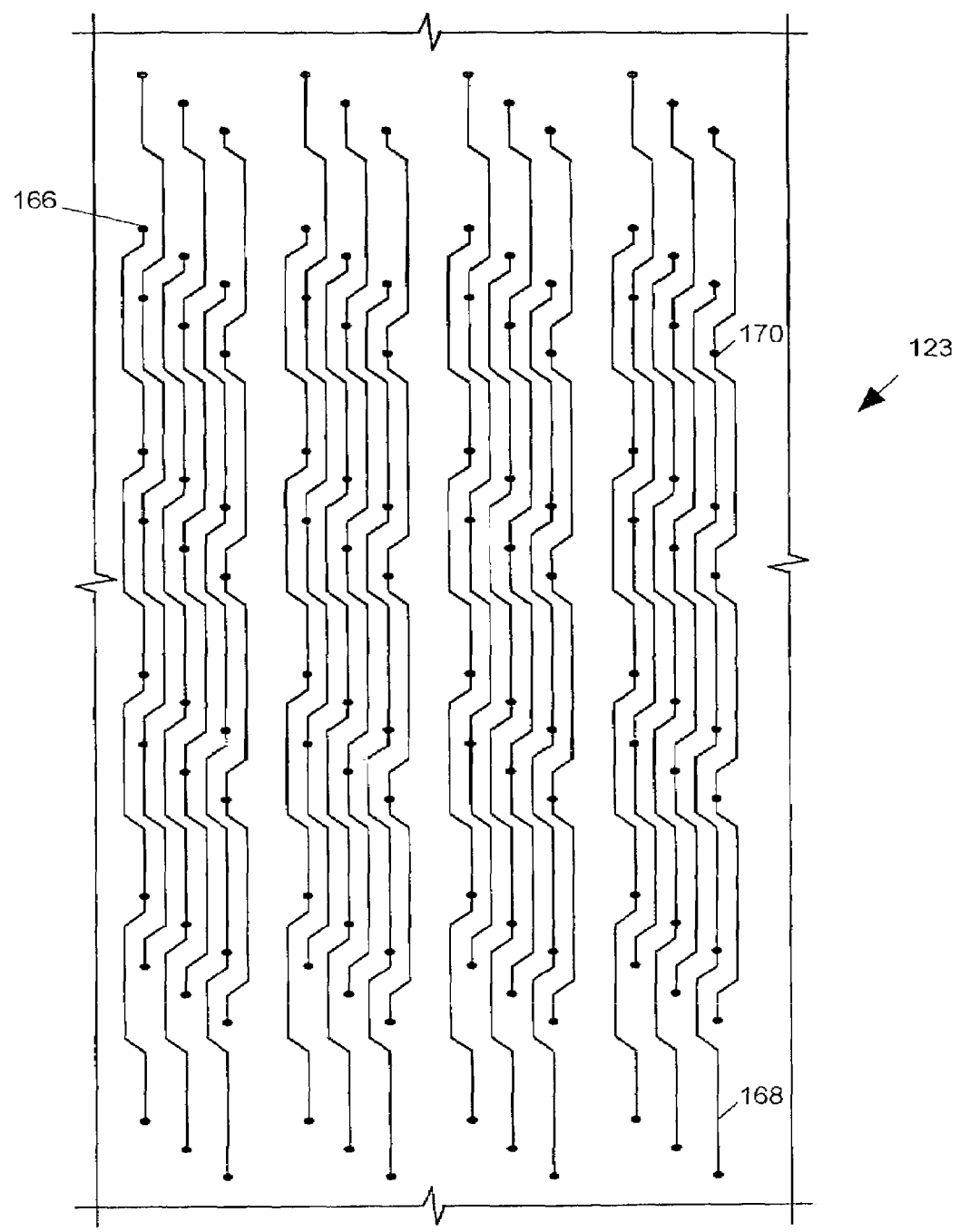

FIG. 16 is a simplified (not to scale) plan view of a portion the layer 123 residing below layer 122 of FIG. 15. Layer 123 includes a set of 24 traces 168, extending generally along "north/south". Vias 166 link north/south tracts 168 to the east/west traces 164 of layer 122 (FIG. 15). Vias 166 and an additional set of vias 170 link north/south traces 168 to the next lower layer.

Figure 17:
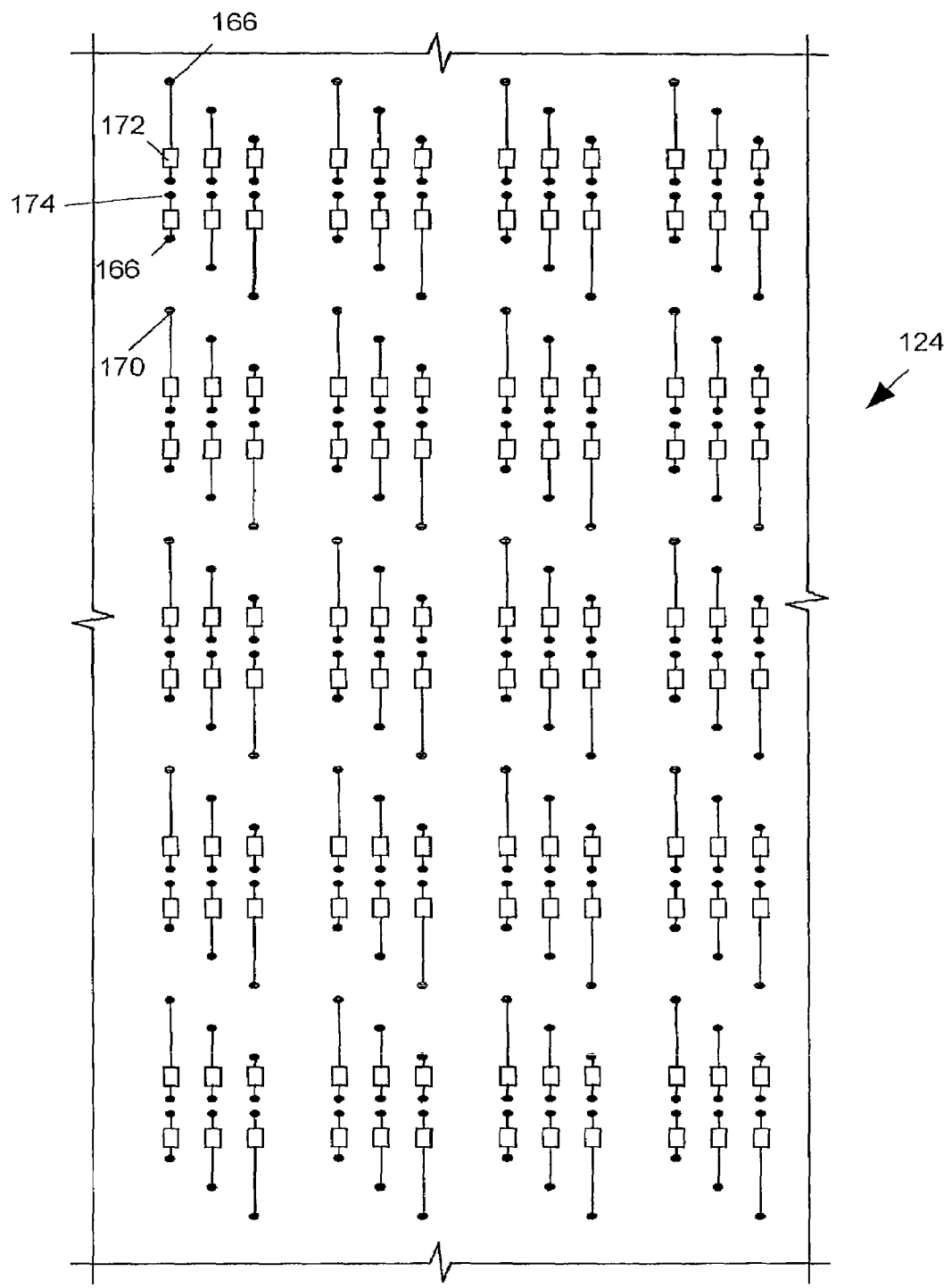

FIG. 17 illustrates the layer 124 below layer 123. Layer 124 includes a set of 120 thin film isolation resistors 172. One end of each isolation resistor 172 is linked to a north/south trace 168 of layer 123 (FIG. 16) through a separate one of vias 166 or 170. A separate via 174 links a second end of each isolation resistor 172 to a next PCB lower layer.

Figure 18:
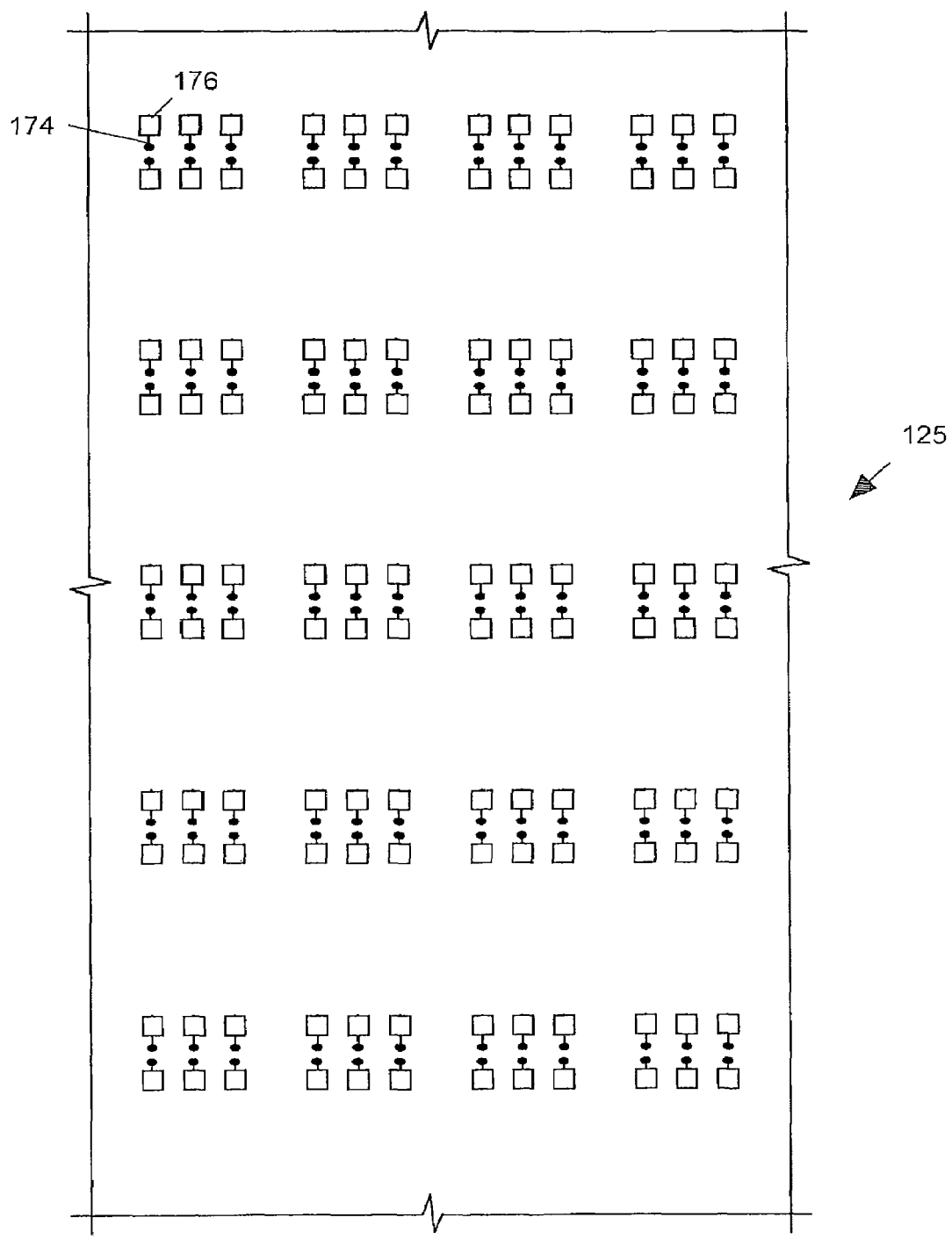
Figure 19:
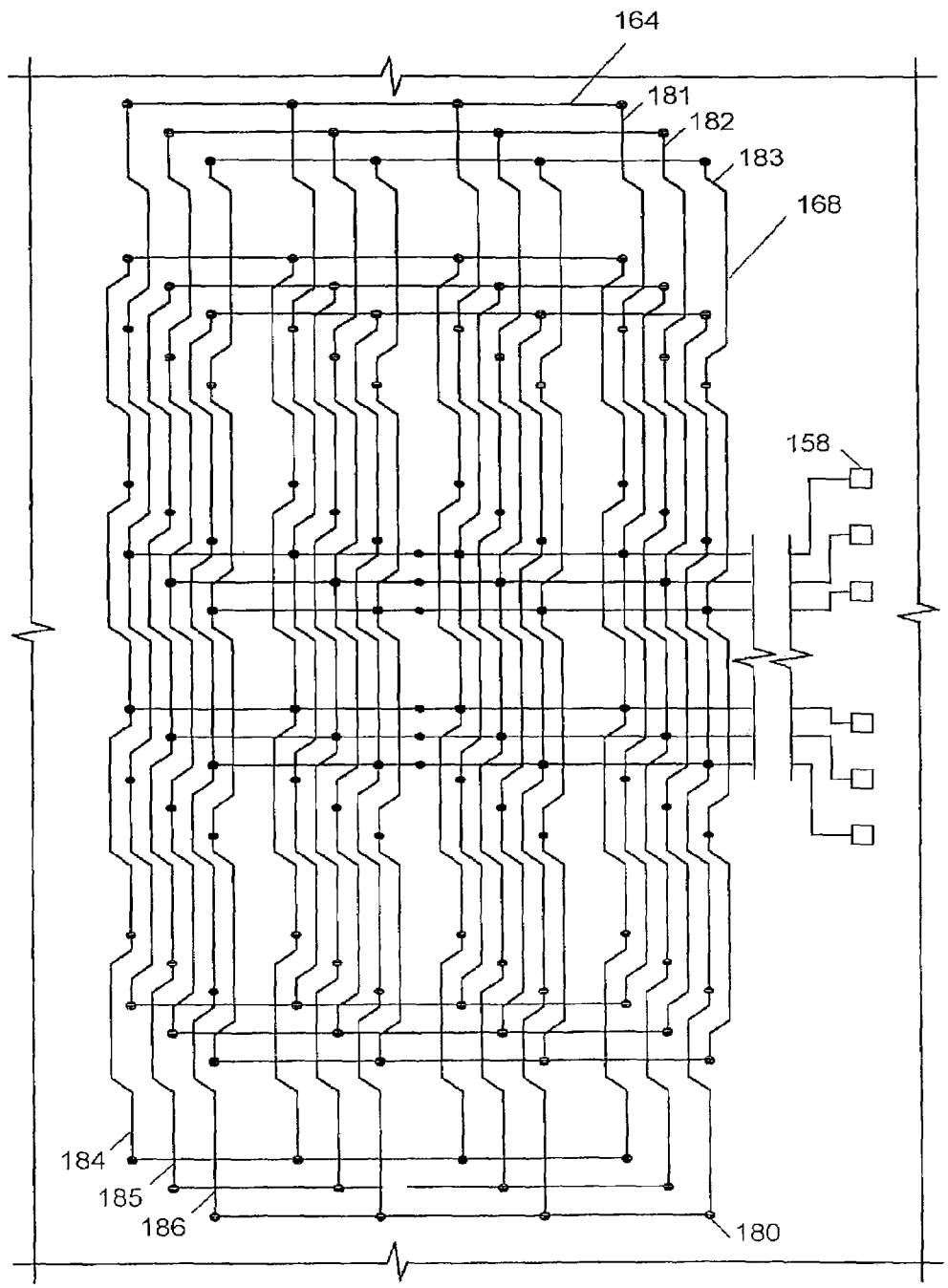

FIG. 18 illustrates the lowest layer 125 on the underside of the PCB. Layer 125 includes a set of contact pads 176, each linked to an isolation resistor 172 of layer 124 (FIG. 17) through a via 174. Pads 176 are arranged to receive ends of spring contacts extending upward from the pads on ICs 152 of FIG. 13.

FIG. 19 is a plan view of three layers 121-123 of FIGS. 14-16 superimposed on one another. Vias 180 thus form an array of several rows and columns of bus nodes wherein each bus node corresponds to a separate one of the I/O pads of the wafer being tested. The east/west traces 164 form one set of daisy-chain buses, each linking all bus nodes of a separate rows of the array and the north/south traces 168 form another set of daisy-chain bus, each linking all bus nodes of separate column of bus nodes. Many of vias 180 act as conductors linking the daisy-chain buses such that each end of each east/west daisy-chain bus is linked to an end of at least one north/south daisy-chain bus, thereby forming a set of six closed-grid buses 181-188, each interconnecting an array of 20 nodes 180 to one of the six pogo pin contact pads 15 that conductively link the closed-grid buses to the tester channels. The isolation resistors 172 of FIG. 17, contact pads 176 of FIG. 17 and spring contacts, conductively link each node (via) 180 to a corresponding IC I/O pad.

In the simple example of FIGS. 13-19, all six I/O pads 154 of each IC 150 or FIG. 13 are separately linked to the six pogo-pin contacts 158 of FIG. 14 through one of closed-grid buses 181-186. However the interconnect structure can be easily modified, for example, by providing additional circuit board layers to provide conventional (non-bus) signal paths between additional pogo pin contacts 158 on the surface layer 121 (FIG. 14) and other I/O pads on ICs 152. Also the pads 176 on layer 125 could be linked to I/O pads of the wafer under test by means other than spring contacts formed on the wafer. For example, a conventional interposer could link pads 176 to a prober accessing the wafer I/O pads through probes. Spring contacts could alternatively be formed on the layer 125 and extend downward to contact the wafer I/O pads.

Thus has been shown and described a closed-grid bus in accordance with the invention for distributing signals to several nodes, and an interconnect structure employing a closed-grid bus for linking channels of an IC tester to pads of multiple integrated circuits on a wafer. The closed-grid bus architecture, which can be efficiently implemented by traces on a multiple layer PCB, provides less variation in signal path delay, provides less signal distortion, maintains better signal integrity and is more fault tolerant than prior art daisy-chain and stubbed buses.

While the forgoing specification has described preferred embodiment(s) of the present invention, one skilled in the art may make many modifications to the preferred embodiment without departing from the invention in its broader aspects. The appended claims therefore are intended to cover all such modifications as fall within the true scope and spirit of the invention.

what is claimed is:

1. An apparatus for providing electrically conductive paths for test signals, said apparatus comprising:
   a substrate;
   a plurality of electrically conductive terminals disposed on said substrate;
   a plurality of electrically conductive traces disposed on said substrate, ones of said traces being electrically connected to ones of said terminals;
   a plurality of electrically conductive probes; and
   a plurality of thin film resistors, ones of said thin film resistors electrically connecting one of said traces with ones of said plurality of said probes,
   wherein said one of said traces is part of a bus structure that electrically connects one of said terminals to said ones of said probes, said bus structure providing a plurality of different conductive paths between said one of said terminals and at least one of said probes.

2. The apparatus of claim 1, wherein said probes are configured to contact an electronic device to be tested.

3. The apparatus of claim 2, wherein said terminals are configured to make connections with a tester configured to control testing of said electronic device.

4. The apparatus of claim 1, wherein said probes comprise spring contact structures.

5. The apparatus of claim 1, wherein at least one of said thin film resistors is embedded within said substrate.

6. The apparatus of claim 5, wherein said substrate comprises a plurality of layers of electrically insulative material, and said at least one of said thin film resistors is disposed between adjacent ones of said layers.

7. The apparatus of claim 1, wherein at least one of said traces are embedded within said substrate.

8. The apparatus of claim 1, wherein said bus structure comprises at least one closed conductive loop.

9. The apparatus of claim 1, wherein:
   said substrate comprises a plurality of layers of electrically insulative material; and
   said bus structure comprises:
      a conductive first via electrically connected to said one of said terminals and passing through a first of said layers of said substrate and
      a plurality of conductive second vias passing through a second of said layers of said substrate,
      wherein said first via is electrically connected to said second vias.

* * * * *